United States Patent
Yamada et al.

(10) Patent No.: US 10,920,317 B2
(45) Date of Patent: Feb. 16, 2021

(54) SHOWER HEAD, VAPOR PHASE GROWTH APPARATUS AND VAPOR PHASE GROWTH METHOD

(71) Applicant: NuFlare Technology, Inc., Kanagawa (JP)

(72) Inventors: Takumi Yamada, Yokohama (JP); Yuusuke Sato, Tokyo (JP)

(73) Assignee: NuFlare Technology, Inc., Kanagawa (JP)

(*) Notice: Subject to any disclaimer, the term of this patent is extended or adjusted under 35 U.S.C. 154(b) by 236 days.

(21) Appl. No.: 15/486,956

(22) Filed: Apr. 13, 2017

(65) Prior Publication Data
US 2017/0298512 A1    Oct. 19, 2017

(30) Foreign Application Priority Data

Apr. 19, 2016  (JP) .................................. 2016-083411

(51) Int. Cl.
*C23C 16/455* (2006.01)
*C23C 16/44* (2006.01)
(Continued)

(52) U.S. Cl.
CPC .... *C23C 16/45565* (2013.01); *C23C 16/4401* (2013.01); *C23C 16/458* (2013.01);
(Continued)

(58) Field of Classification Search
None
See application file for complete search history.

(56) References Cited

U.S. PATENT DOCUMENTS 6,132,512 A * 10/2000 Horie ................ C23C 16/45565
                                              118/715
6,444,042 B1 * 9/2002 Yang ................. C23C 16/45565
                                              118/715
(Continued)

FOREIGN PATENT DOCUMENTS

CN       201099698 Y     8/2008
CN       102762764 A    10/2012
(Continued)

OTHER PUBLICATIONS

Office Action dated Feb. 26, 2019 for the corresponding Chinese Patent Application No. 201710248403.1 and English translation.
(Continued)

*Primary Examiner* — Binu Thomas
(74) *Attorney, Agent, or Firm* — Rankin, Hill & Clark LLP

(57) ABSTRACT

A shower head that supplies a process gas in a vapor phase growth apparatus includes a mixing chamber; and a plurality of cooling portions provided below the mixing chamber with gaps between cooling portions. The cooling portion includes a cooling hole provided in a horizontal direction, and the gaps extend linearly in the horizontal direction. The shower head further includes, below the gaps, a plurality of buffer regions extending linearly in the horizontal direction. The shower head further includes, below the buffer regions, a shower plate including a plurality of through holes disposed at a predetermined interval. The shower head can uniformly supply the process gas.

10 Claims, 6 Drawing Sheets

(51) Int. Cl.
   *C23C 16/458*   (2006.01)
   *H01L 21/02*    (2006.01)

(52) U.S. Cl.
   CPC .. *C23C 16/45519* (2013.01); *C23C 16/45572* (2013.01); *H01L 21/02598* (2013.01); *H01L 21/0254* (2013.01); *H01L 21/0262* (2013.01)

(56) References Cited

U.S. PATENT DOCUMENTS

| | | | |
|---|---|---|---|
| 9,224,581 B2 | 12/2015 | Mai | |
| 2006/0137820 A1* | 6/2006 | Lee | H01L 21/67069 156/345.37 |
| 2012/0304933 A1* | 12/2012 | Mai | C23C 16/45565 |
| 2013/0220222 A1* | 8/2013 | Huang | C23C 16/45565 118/713 |
| 2013/0276703 A1* | 10/2013 | Cheng | C23C 16/45565 118/724 |
| 2013/0299009 A1 | 11/2013 | Jiang et al. | |
| 2016/0273109 A1* | 9/2016 | Harada | C23C 16/45565 |
| 2017/0130335 A1 | 5/2017 | Yamada et al. | |

FOREIGN PATENT DOCUMENTS

| | | |
|---|---|---|
| CN | 105990190 A | 10/2016 |
| JP | 2010232402 | 10/2010 |
| JP | 2013-172153 | 9/2013 |
| JP | 2013-239707 | 11/2013 |
| JP | 2017-92140 | 5/2017 |
| TW | 201109464 | 3/2011 |

OTHER PUBLICATIONS

Taiwanese Office Action dated Nov. 30, 2017 issued in the corresponding Taiwanese patent application No. 106112109 and its English translation.

Chinese Office Action dated Sep. 12, 2019 issued in the corresponding Chinese patent application No. 201710248403.1 and its machine English translation.

Chinese Decision of Rejection dated Mar. 2, 2020 issued in Chinese patent application No. 201710248403.1 and its English machine translation.

Japanese Office Action dated Jan. 7, 2020 issued in the corresponding Japanese patent application No. 2016-083411 and its English translation.

* cited by examiner

SHOWER HEAD, VAPOR PHASE GROWTH APPARATUS AND VAPOR PHASE GROWTH METHOD

CROSS-REFERENCE TO RELATED APPLICATION

This application is based upon and claims the benefit of priority from Japanese Patent Applications No. 2016-083411, filed on Apr. 19, 2016, the entire contents of which are incorporated herein by reference.

FIELD OF THE INVENTION

The present invention relates to a shower head that supplies a process gas, a vapor phase growth apparatus using the shower head, and a vapor phase growth method.

BACKGROUND OF THE INVENTION

As a method for forming a high-quality semiconductor film, there is an epitaxial growth technique that forms a film on a substrate using vapor phase growth. In a vapor phase growth apparatus using the epitaxial growth technique, a substrate is placed on a support portion in the vapor phase growth apparatus which is maintained at atmospheric pressure or reduced pressure. Then, a process gas which will be a raw material is supplied to the substrate while the substrate is heated. For example, the thermal reaction of the process gas occurs in the surface of the substrate and an epitaxial single-crystal film is formed.

When the process gas is supplied to the substrate, it is preferable to uniformly supply the process gas onto the substrate, using a shower head. While a film is being formed, the temperature of the shower head increases, which may cause the damage or deformation of the shower head or the thermal reaction of the process gas. For this reason, the shower head is cooled.

SUMMARY OF THE INVENTION

A shower head according to an embodiment includes: a mixing chamber to which process gas is supplied; a plurality of cooling portions provided below the mixing chamber with a gap therebetween, the cooling portion having a cooling hole provided in a horizontal direction, the process gas being introduced from the mixing chamber to the gaps; a plurality of buffer regions provided below the gaps, the process gas being introduced from the gaps to the buffer regions; and a shower plate provided below the buffer regions, the shower plate having a plurality of through holes disposed at a predetermined interval, the process gas being introduced from the buffer regions to the through holes.

A vapor phase growth apparatus according another embodiment includes the shower head according to the above-mentioned aspect, a reaction chamber provided below the shower head, and a support portion which is provided in the reaction chamber, the support portion on which a substrate can be placed.

A vapor phase growth method according to still another embodiment includes: supplying a cooling medium to cooling holes provided in a plurality of cooling portions in a horizontal direction, the cooling portions being provided below a mixing chamber with a gap therebetween; supplying process gases to the mixing chamber; cooling the process gases supplied to buffer regions through the gaps with the cooling medium, the buffer regions being provided below the gaps; supplying the cooled process gases to a reaction chamber through a plurality of through holes disposed in a shower plate at a predetermined interval, the shower plate being provided below the buffer regions; and growing a film on a substrate placed in the reaction chamber using the process gases.

DETAILED DESCRIPTION OF THE EMBODIMENTS

Hereinafter, embodiments of the invention will be described with reference to the drawings.

In the specification, the direction of gravity in a state in which a vapor phase growth apparatus is provided so as to form a film is defined as a "lower" direction and a direction opposite to the direction of gravity is defined as an "upper" direction. Therefore, a "lower portion" means a position in the direction of gravity relative to the reference and a "lower side" means the direction of gravity relative to the reference. In addition, an "upper portion" means a position in the direction opposite to the direction of gravity relative to the reference and an "upper side" means the direction opposite to the direction of gravity relative to the reference.

In the specification, "process gas" is a general term of gas used to form, a film on a substrate. The "process gas" includes, for example, raw material gas, source gas, and carrier gas.

A shower head according to this embodiment includes: a mixing chamber to which process gas is supplied; a plurality of cooling portions provided below the mixing chamber with a gap therebetween, the cooling portion having a cooling hole provided in a horizontal direction, the process gas being introduced from the mixing chamber to the gaps; a plurality of buffer regions provided below the gaps, the process gas being introduced from the gaps to the buffer regions; and a shower plate provided below the buffer regions, the shower plate having a plurality of through holes disposed at a predetermined interval, the process gas being introduced from the buffer regions to the through holes.

Figure 1:
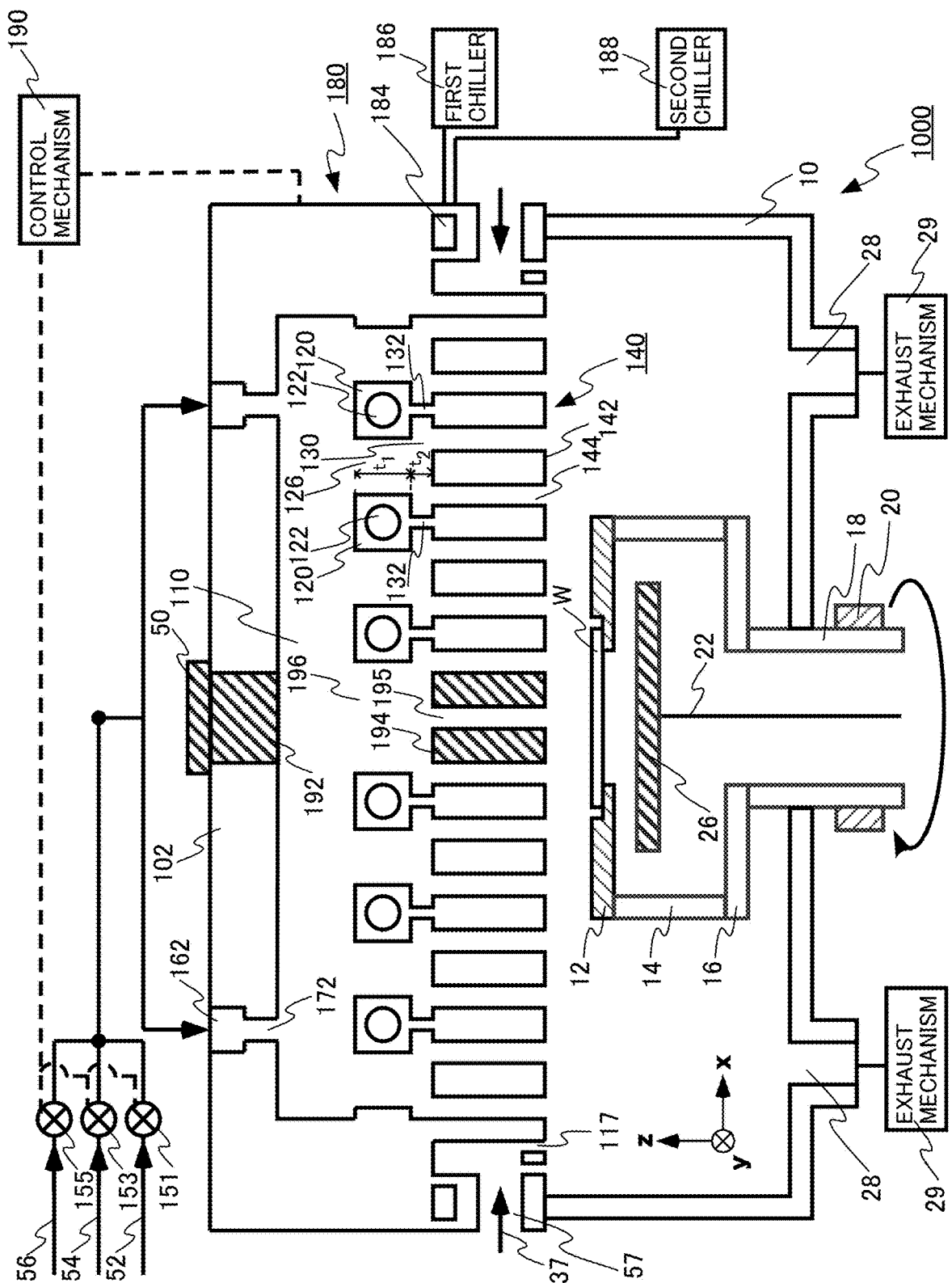
FIG. 1 is a cross-sectional view schematically illustrating a main portion of a vapor phase growth apparatus according to an embodiment.
Figure 2:
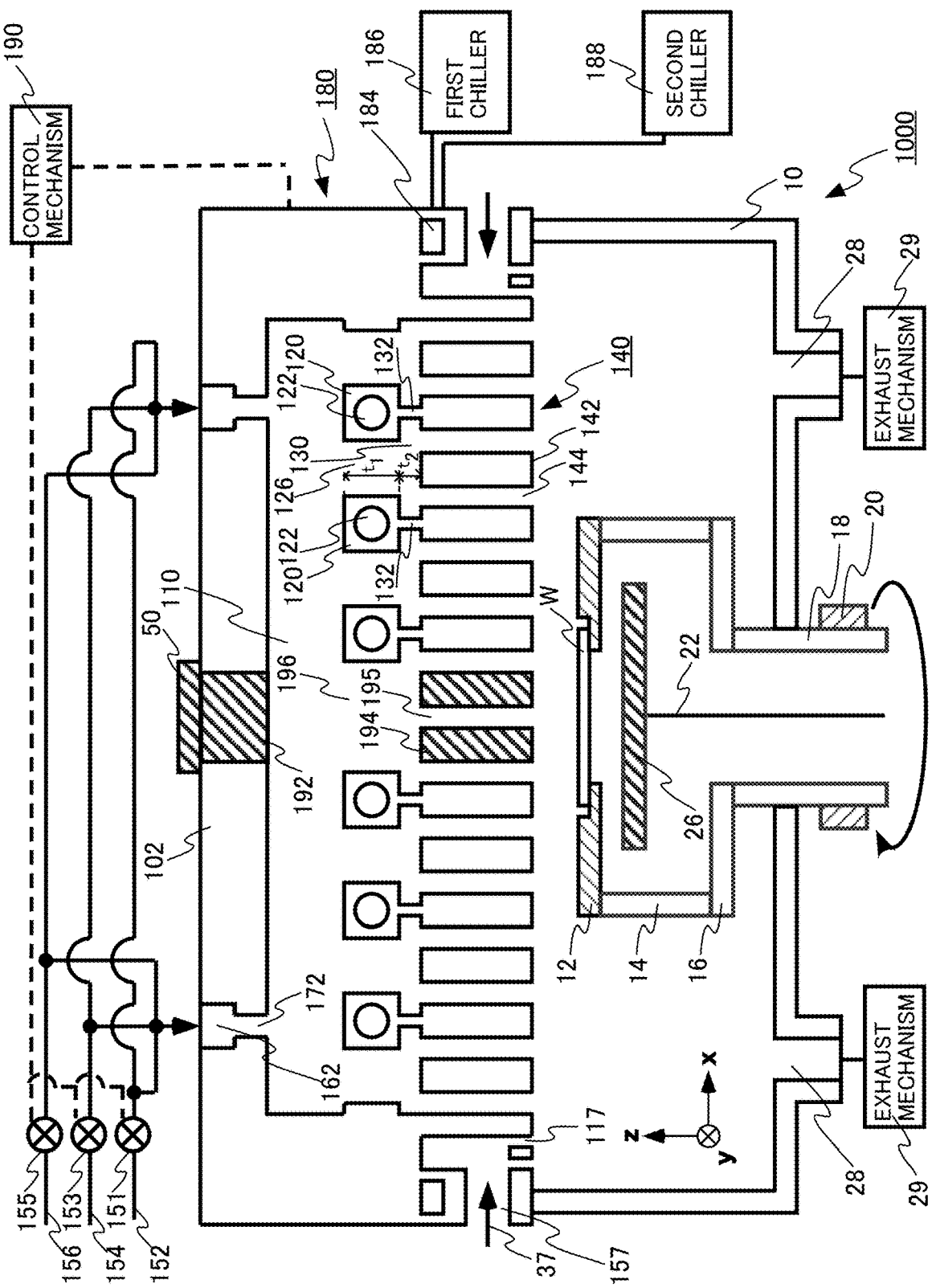
FIG. 2 is a cross-sectional view schematically illustrating a main portion of a vapor phase growth apparatus according to another aspect of the embodiment.
Figure 3:
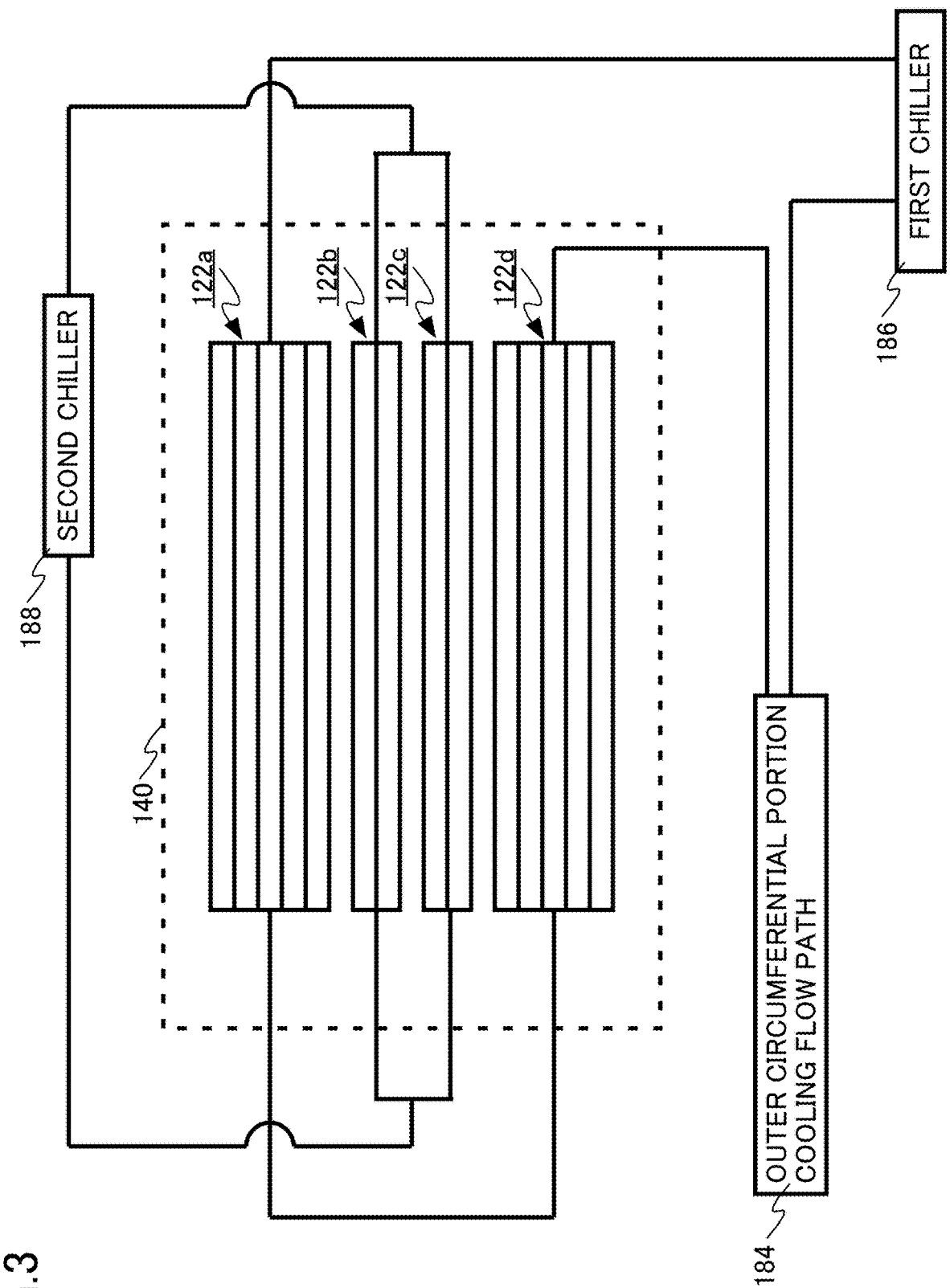
FIG. 3 is a diagram schematically illustrating a main portion of an outer circumferential portion cooling mechanism and cooling holes according to the embodiment.
Figure 4:
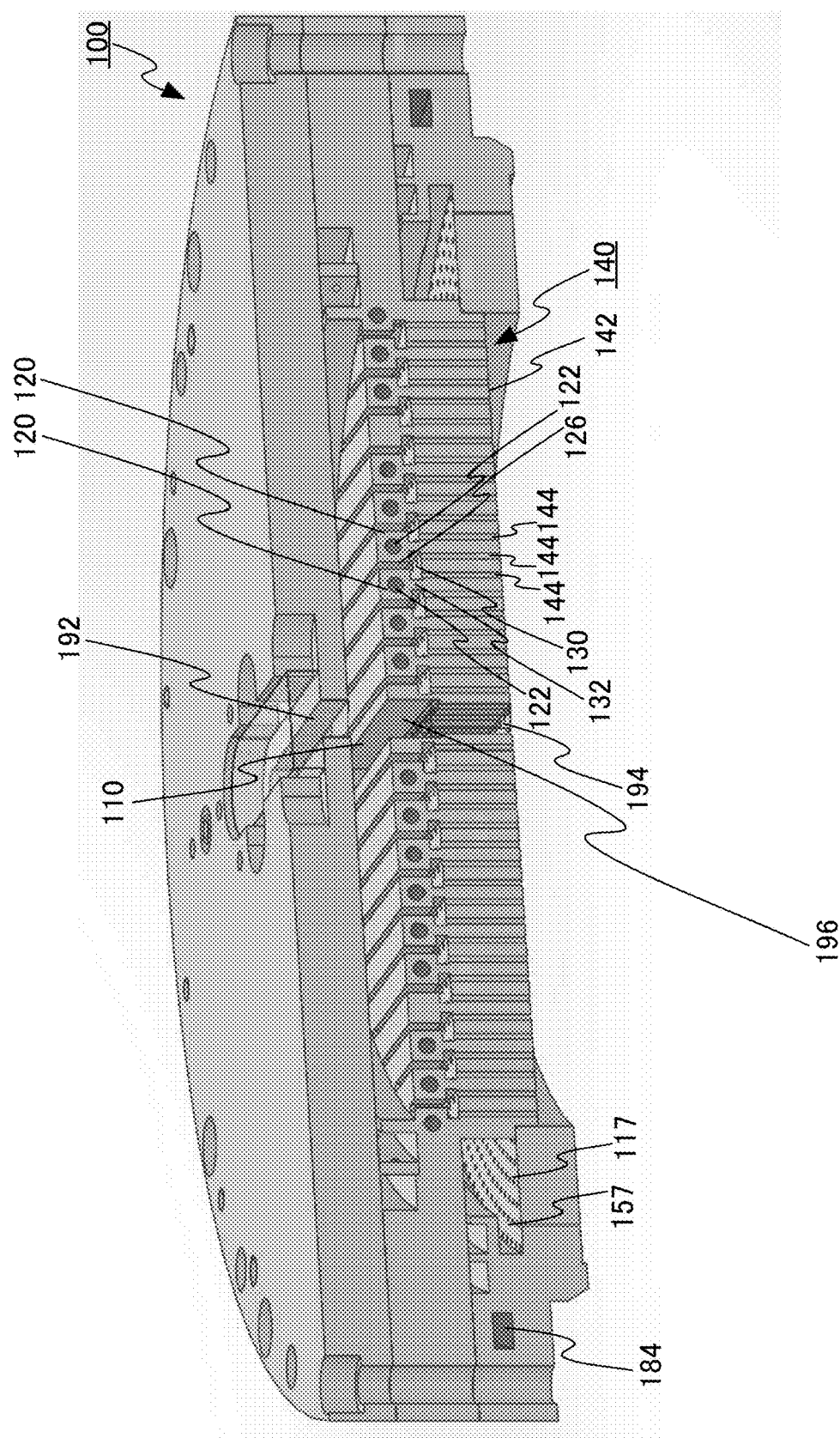
FIG. 4 is a cross-sectional perspective view illustrating a main portion of a shower head according to the embodiment.
Figure 5:
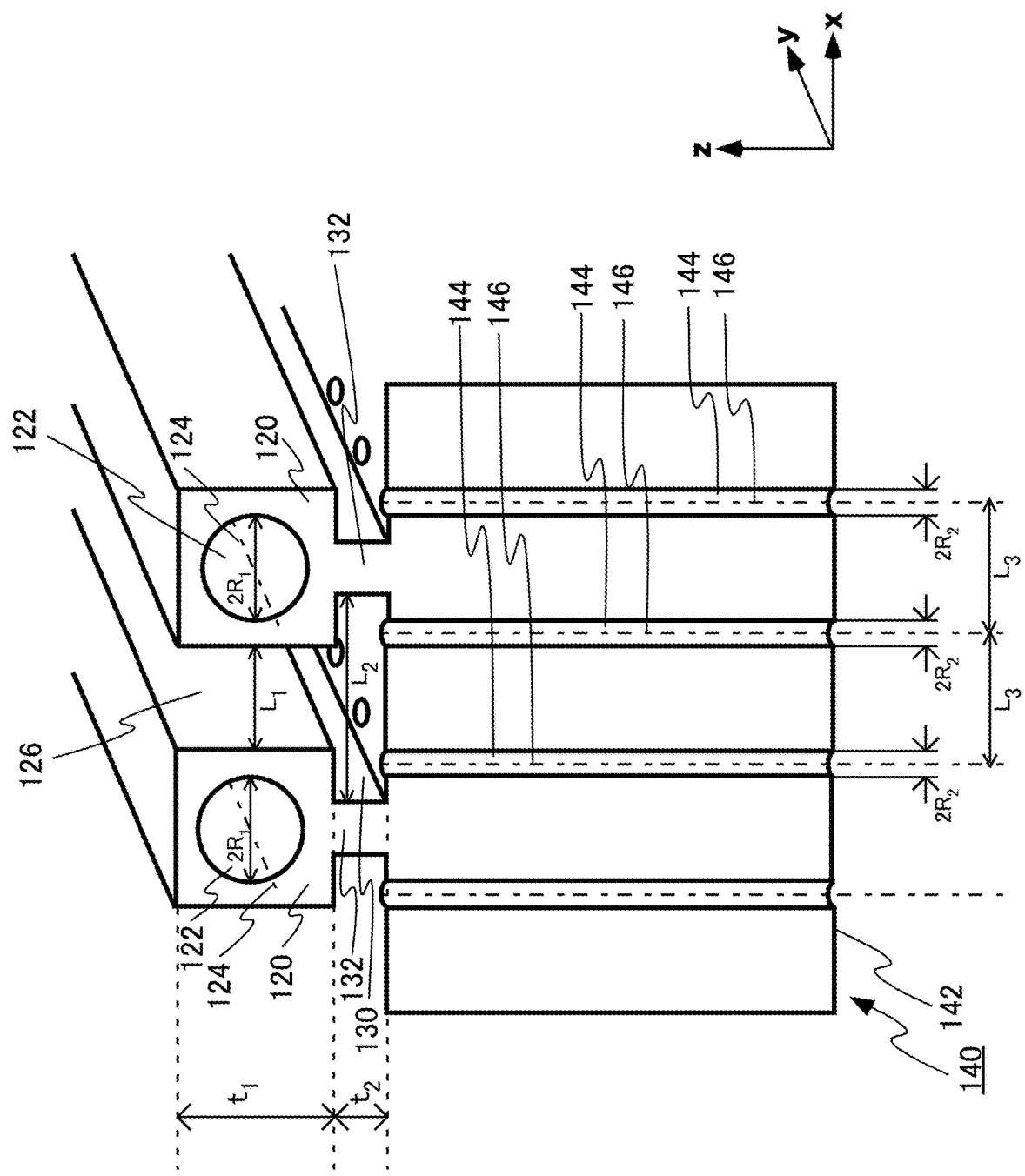
FIG. 5 is a cross-sectional perspective view illustrating a main portion of the shower head according to the embodiment.

FIG. 1 is a cross-sectional view schematically illustrating a main portion of a vapor phase growth apparatus according to the embodiment. FIG. 2 is a cross-sectional view schematically illustrating a main portion of a vapor phase growth apparatus according to another aspect of the embodiment. FIG. 3 is a diagram schematically illustrating a main portion of an outer circumferential portion cooling mechanism and cooling holes according to the embodiment. FIG. 4 is a cross-sectional perspective view illustrating a main portion of a shower head according to the embodiment. FIG. 5 is a cross-sectional perspective view illustrating a main portion of the shower head according to the embodiment.

The vapor phase growth apparatus according to the embodiment is, for example, a vertical single-wafer-type epitaxial growth apparatus using a metal organic chemical vapor deposition (MOCVD) method. The epitaxial growth apparatus according to the embodiment grows a group III-V nitride-based semiconductor single-crystal film, such as a gallium nitride (GaN) film, an aluminum nitride (AlN) film, an aluminum gallium, nitride (AlGaN) film, or an indium gallium nitride (InGaN) film.

A vapor phase growth apparatus 1000 includes a reaction chamber 10. A film is grown in the reaction chamber 10.

The reaction chamber 10 includes a support portion 12 on which a wafer (substrate) W is placed and which rotates the wafer W in a circumferential direction of the wafer W. The wafer W is, for example, a silicon (Si) wafer or a sapphire wafer. For example, a holder which has an opening at the center and supports the substrate on a circumferential edge is used as the support portion 12. However, the support portion 12 may be a susceptor without an opening. In addition, the support portion 12 is provided with, for example, a push-up pin (not illustrated) that is used to attach or detach the wafer W to or from the support portion 12.

An upper end of a rotating shaft 18 is provided in the reaction chamber 10. The support portion 12 is connected to the upper end of the rotating shaft 18 through a rotating ring 14 and a rotating base 16 that is provided below the rotating ring 14. The rotating shaft 18 is rotated by a rotating mechanism 20 that is provided around the rotating shaft 18 to rotate the wafer W in the circumferential direction. The rotating mechanism 20 is, for example, a motor or a combination of a motor and a gear. The structures of the rotating ring 14, the rotating base 16, and the rotating shaft 18 are not limited thereto.

A gas exhaust portion 28 for exhausting the surplus process gas and a by-product of reaction is provided in a lower part of the reaction chamber 10 and is connected to an exhaust mechanism 29 that exhausts gas and includes, for example, a vacuum pump and a valve for changing the internal pressure of the reaction chamber 10 to a predetermined pressure.

A heating unit 26 is supplied with power by, for example, an external power supply (not illustrated) through an electrode 22 that passes through the inside of the rotating shaft 18 and a current introduction terminal (not illustrated) and generates heat.

The reaction chamber 10 includes a wafer unloading/loading port (not illustrated). The wafer unloading/loading port is used to load the wafer W into the reaction chamber 10 and to unload the wafer W from, the reaction chamber 10. Here, for example, a robot hand (not illustrated) is used to load and unload the wafer W. The wafer W loaded by the robot hand is supported by the support portion 12 in the reaction chamber 10. A method for loading and unloading the wafer W is not limited thereto.

A shower head 100 is provided above the reaction chamber 10. The shower head 100 includes a first transparent member 192, a second transparent member 194, a top plate 102, a mixing chamber 110, a cooling portion 120, a cooling hole 122, a gap 126, a buffer region 130, a connection portion 132, a shower plate 140, a through hole 144, a connection flow path 172, a purge gas supply path 37, a purge gas connection flow path 157, and a purge gas discharge hole 117.

For example, two gas supply holes 162 are provided and each process gas that is supplied through a first gas supply path 152 for supplying a first process gas, a second gas supply path 154 for supplying a second process gas, and a third gas supply path 156 for supplying a third process gas is introduced to the two gas supply holes 162. Each process gas introduced through the gas supply holes 162 is introduced to the mixing chamber 110 through, for example, connection flow paths 172.

In the vapor phase growth apparatus illustrated in FIG. 1, the first process gas, the second process gas, and the third process gas are mixed. The flow path of the mixed gas is separated into two paths and the mixed gas is supplied to the mixing chamber 110 through two gas supply holes 162 and two connection flow paths 172. In the vapor phase growth apparatus illustrated in FIG. 2, first, the flow path of each of the first, process gas, the second process gas, and the third process gas is separated into two paths. Then, the first process gas, the second process gas, and the third process gas, each of which flows through two separated paths, are mixed and the mixed gas is supplied to the mixing chamber 110 through the two gas supply holes 162 and the two connection flow paths 172.

For example, when a GaN single-crystal film is formed on the wafer W by an MOCVD method, hydrogen ($H_2$) is supplied as the first process gas. In addition, ammonia ($NH_3$) which is the source gas of nitrogen (N) is supplied as the second process gas. Furthermore, gas obtained by diluting trimethylgallium (TMG) which is the source gas of gallium (Ga) with hydrogen ($H_2$) which is carrier gas is supplied as the third process gas.

A plurality of cooling portions 120 are provided below the mixing chamber 110 with a gap 126 therebetween. The process gas is introduced from the mixing chamber 110 to the gaps 126.

The plurality of cooling portions 120 include cooling holes 122 which are provided in a horizontal direction. The inside diameter of the cooling hole 122 is $2R_1$. A cooling medium flows through the cooling holes 122 to cool the shower head 100. The cooling medium is, for example, water.

It is assumed that a direction opposite to the vertical direction is the Z direction, one of the directions perpendicular to the Z direction is the X direction, and a direction perpendicular to the Z direction and the X direction is the Y direction. When the vapor phase growth apparatus 1000 is disposed so as to form a film, the plurality of cooling portions 120 are provided in the X direction with the gap 126 therebetween. The cooling portion 120 and the cooling hole 122 are provided so as to extend in parallel to the Y direction. A center line 124 of the cooling hole 122 is parallel to the Y direction. The inside diameter $2R_1$ of the cooling hole 122 is taken in a plane parallel to the XZ plane.

A plurality of buffer regions 130 are provided below the gaps 126 so as to correspond to each gap 126. The process gas is introduced to each of the buffer regions 130 through the gaps 126.

The shower plate 140 is provided below the buffer regions 130. The shower plate 140 includes a plurality of through holes 144 and a main surface 142. The inside diameter of each of the plurality of through holes 144 is $2R_2$. Here, $2R_2$ is taken in a plane parallel to the XY plane. The plurality of through holes 144 are provided at a predetermined interval $L_3$ in the X direction. Here, the predetermined interval $L_3$ is the interval between the center lines 146 of the through holes 144. The plurality of through holes 144 are provided at the predetermined interval $L_3$ in the Y direction. The center lines 146 of the plurality of through holes 144 are parallel to the Z direction. Therefore, the center lines 146 of the plurality of through holes 144 are perpendicular to the center line of the cooling hole 122. The process gas is introduced from the buffer regions 130 to the plurality of through holes 144. The main surface 142 is a surface that is provided closer to the reaction chamber of the shower head 100 and is parallel to the XY plane.

The plurality of cooling portions 120 are connected to the shower plate 140 by connection portions 132 that are provided below the cooling portions 120. The buffer region 130 is provided between a plurality of connection portions 132.

The process gas supplied to the through hole 144 is supplied into the reaction chamber 10. The process gas supplied into the reaction chamber 10 is used to form a film on the wafer W placed on the support portion 12 in the reaction chamber 10. The surplus process gas and the by-product generated by deposition are discharged by the gas exhaust portion 28.

The width $L_1$ of the gap 126 in a first direction which is parallel to the main surface 142 of the shower plate 140 and is perpendicular to the center line 124 of the cooling hole 122 is less than the width $L_2$ of the buffer region 130 in a direction parallel to the first direction. In this case, the process gas supplied to the gap 126 is supplied to the buffer region 130 and temporarily stays in the buffer region 130. Therefore, the process gas is uniformly supplied to the plurality of through holes 144. In this embodiment, the main surface 142 is provided in the XY plane. The center line of the cooling hole 122 is parallel to the Y direction. Therefore, the first direction is parallel to the X direction and the length $L_1$ of the gap 126 in the first direction that is parallel to the main surface 142 of the shower plate 140 and is perpendicular to the center line 124 of the cooling hole 122 is parallel to the X direction.

The sum of the inside diameter $2R_2$ of the through hole 144 and the predetermined interval $L_3$ in a direction parallel to the first direction is equal to or less than the width $L_2$ of the buffer region 130 in the first direction (width direction). When the sum of the inside diameter $2R_2$ of the through hole 144 and $L_3$ is larger than $L_2$, the through hole 144 is disposed below the connection portion 132. In this case, the process gas is not efficiently supplied to the through hole 144 and the process gas is not uniformly supplied to the wafer W.

The inside diameter $2R_1$ of the cooling hole 122 is less than the length $t_1$ of the cooling portion 120 in a direction perpendicular to the main surface 142 of the shower plate 140, that is, the Z direction. The reason is that, when $2R_1$ is equal to or larger than $t_1$, it is difficult to dispose the cooling hole 122 in the cooling portion 120.

The inside diameter $2R_1$ of the cooling hole 122 is larger than the length $t_2$ of the buffer region 130 in the direction perpendicular to the main surface 142 of the shower plate 140. In this case, the inside diameter of the cooling hole 122 increases and the length of the buffer region 130 decreases to reduce the distance between the cooling portion 120 and the shower plate 140. Therefore, a large amount of cooling medium flows through the cooling holes 122 and the shower plate 140 is efficiently cooled by the cooling portions 120.

The length $t_2$ of the buffer region 130 in the direction perpendicular to the main surface 142 of the shower plate 140 is larger than the inside diameter $2R_2$ of the through hole 144. In this case, a sufficient amount of process gas stays in the buffer region 130 and is then supplied to the through hole 144.

The cooling portions 120, the connection portions 132, and the shower plate 140 can be integrally manufactured. In addition, the cooling portions 120, the connection portions 132, and the shower plate 140 may be independently manufactured and then bonded to each other.

It is preferable that the vapor phase growth apparatus 1000 further include the purge gas supply path 37 for supplying purge gas. In this case, it is possible to prevent a film from being deposited on the sidewall of the reaction chamber and to form a film with a small number of defects on the substrate. The purge gas is supplied to the outer circumference of the wafer W along the sidewall of the reaction chamber 10 in order to prevent a film from being deposited on the inner surface (inner wall) of the side wall of the reaction chamber 10 during deposition. The purge gas includes, for example, at least one kind of gas selected from nitrogen, hydrogen, and inert gas.

The purge gas discharge hole 117 is connected to the purge gas connection flow path 157. The purge gas connection flow path 157 is formed as a ring-shaped hallow portion in an outer circumferential region of the shower head 100. The purge gas supply path 37 is connected to the purge gas connection flow path 157. Therefore, the purge gas supply path 37 is connected to a plurality of purge gas discharge holes 117 through the purge gas connection flow path 157.

An outer circumferential portion cooling mechanism 180 includes an outer circumferential portion cooling flow path 184, a first chiller 186, and a second chiller 188. The cooling medium supplied from the first chiller 186 cools an O-ring (not illustrated) between the reaction chamber 10 and the shower plate 140 in the outer circumferential portion cooling flow path 184 and cools six cooling holes 122a and six cooling holes 122d which are arranged from the edge of the shower plate 140. The cooling medium supplied from the second chiller 188 cools three cooling holes 122b and three cooling holes 122c which are arranged from the center of the shower plate 140. The aspect of the outer circumferential portion cooling mechanism 180 is not limited thereto. For example, a known cooling fin may be used.

A control mechanism 190 is connected to the rotating mechanism 20 and controls the rotation and rotation speed of the wafer W by the rotating mechanism 20. In addition, the control mechanism 190 is connected to the heating unit 26 and controls the temperature of the wafer W. The control mechanism 190 is connected to the exhaust mechanism 29 and controls the internal pressure of the reaction chamber 10. The control mechanism 190 is connected to flow rate control mechanisms 151, 153, and 155 which are provided in the first gas supply path 152, the second gas supply path 154, and the third gas supply path 156, respectively, and controls the flow rate of each gas. In addition, the control mechanism 190 appropriately controls, for example, the transferring of the wafer W by the robot hand. A known mass flow controller, a known needle valve, or a combination thereof is used as the flow rate control mechanisms 151, 153, and 155.

The control mechanism 190 may be hardware, such as an electric circuit or a quantum circuit, or may be software. When the control mechanism 190 is software, a microprocessor, such as a central processing unit (CPU), a read only memory (ROM) that stores a processing program, a random access memory (RAM) that temporarily stores data, an input/output port, and a communication port may be used. A recording medium is not limited to a detachable recording medium, such as a magnetic disk or an optical disk, and may be a fixed recording medium, such as a hard disk drive or a memory.

A measurement device 50 is provided on the top plate 102. The measurement device 50 is, for example, a device that measures the warping of the wafer W using a laser, a device that measures the thickness or quality of a film grown on the wafer W using a laser, or a radiation thermometer that measures the temperature of the wafer W using radiation from the wafer W.

The first transparent member 192 is provided in the top plate 102. The second transparent member 194 is provided in the shower plate 140. The second transparent member 194 includes through holes 195 which have the same diameter as the through holes 144 and are provided at the same pitch as the through holes 144 and to which the mixed process gas is introduced. The first transparent member 192 and the second transparent member 194 transmit laser beams emitted from the measurement device 50 or radiation from the wafer W.

It is preferable that the first transparent member 192 or/and the second transparent member 194 pass through the top plate 102 and the shower plate 140 in order to effectively irradiate the wafer W with laser beams and detect reflected laser beams, or to effectively detect the radiation. It is preferable that the first transparent member 192 be disposed immediately above the second transparent member 194 and the measurement device 50 be disposed immediately above the first, transparent, member 192.

The first transparent member 192 and the second transparent member 194 are sufficiently transparent with respect to a predetermined wavelength used in the measurement device 50 and are preferably, for example, quartz glass. Any member may be used as long as it has sufficiently strength, is sufficiently transparent with respect to a predetermined wavelength, and has high resistance to, for example, process gas. For example, sapphire can be preferably used.

The cooling portion 120 and the cooling hole 122 may not be provided in a region 196 above the second transparent member 194 such that measurement by the measurement device 50 is not hindered. According to this structure, when the second transparent member 194 is provided in the shower plate 140, a means for attaching the second transparent member 194 to the shower plate 140 from the upper side of the shower plate 140 is used, which makes it possible to easily manufacture the shower head 100.

Next, the function and effect of the shower head 100 and the vapor phase growth apparatus 1000 according to the embodiment, will be described.

In the shower head 100 according to the embodiment, each cooling portion 120 is cooled by the cooling medium that flows through the cooling hole 122. The shower plate 140 is cooled by the cooling portions 120 through the connection portions 132. Therefore, it is possible to uniformly cool the shower head 100.

The process gas that has passed through the gap 126 temporarily stays in the buffer region 130 and is then supplied to the reaction chamber 10 through the through holes 144 and 195. Therefore, according to the shower head 100 of the embodiment, it is possible to uniformly supply the process gas to the reaction chamber 10.

The shower head 100 is cooled by the outer circumferential portion cooling flow path 184 from the outer circumferential side. Therefore, according to the shower head 100 of the embodiment, it is possible to provide a shower head that can be further uniformly cooled.

According to the vapor phase growth apparatus of the embodiment, it is possible to uniformize the pressure loss of the through holes 144 provided in the shower head 100 and to uniformize the flow volume and flow rate of the process gas, entirely. In addition, a temperature distribution can be controlled by two cooling mechanisms provided inside and outside the shower plate 140 such that the temperature of the process gas passing through the shower plate 140 is uniform or the process gas has the temperature distribution. Therefore, according to the vapor phase growth apparatus of the embodiment, it is possible to uniformly supply the process gas to the reaction chamber 10 and to grow a high-quality film on the substrate.

Figure 6:
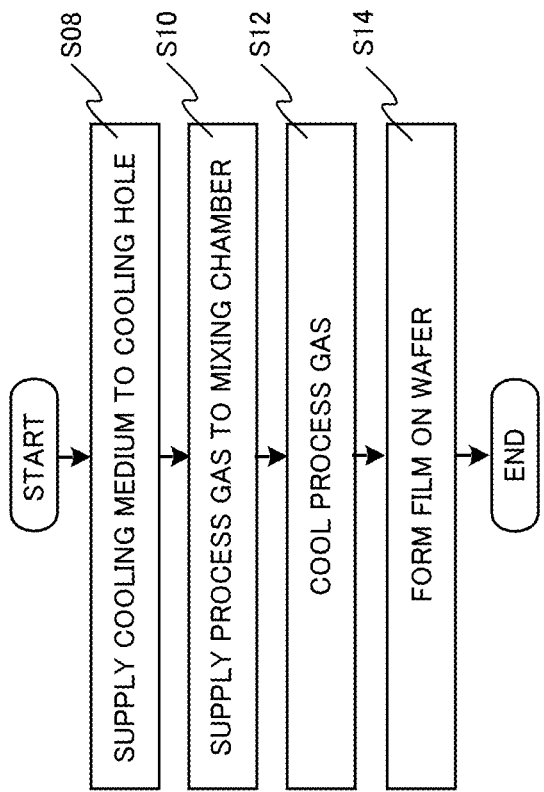
FIG. 6 is a flowchart illustrating a vapor phase growth method according to the embodiment.

FIG. 6 is a flowchart illustrating a vapor phase growth method according to the embodiment.

The vapor phase growth method according to the embodiment includes: supplying a cooling medium to cooling holes provided in a plurality of cooling portions in a horizontal direction, the cooling portions being provided below a mixing chamber with a gap therebetween; supplying process gases to the mixing chamber; cooling the process gases supplied to buffer regions through the gaps with the cooling medium, the buffer regions being provided below the gaps; supplying the cooled process gases to a reaction chamber through a plurality of through holes disposed in a shower plate at a predetermined interval, the shower plate being provided below the buffer regions; and growing a film on a substrate placed in the reaction chamber using the process gases.

First, the control mechanism 190 loads the wafer W to the reaction chamber 10 and places the wafer W on the support portion 12, using, for example, the robot hand. Then, the control mechanism 190 heats the wafer W, using the heating unit 26. Then, the control mechanism 190 rotates the wafer W at a predetermined rotation speed in the circumferential direction of the wafer W, using the rotating mechanism 20.

Then, the first chiller 186 supplies the cooling medium to the cooling holes 122 of a plurality of cooling portions 120 which have the cooling holes 122 formed therein and are provided below the mixing chamber 110 with the gap 126 therebetween (S08). In addition, the second chiller 188 supplies the cooling medium, to the outer circumferential portion cooling flow path 184. The outer circumferential portion cooling flow path 184 may be connected in series to the cooling holes 122. Alternatively, the cooling hole 122 may have a double tube structure, an outer tube may be connected in series to the outer circumferential portion cooling flow path 184 and may be controlled by the first chiller, and an inner tube may be controlled by the second chiller. The cooling holes may be controlled by the control mechanism 190.

Then, the first process gas and the second process gas, of which the flow rate has been controlled by the control mechanism 190, are mixed. If necessary, the third process gas is mixed with the first process gas and the second process gas. Then, the mixed gas is supplied to the mixing chamber 110 (S10).

Then, the process gas that is supplied to the buffer region 130, which is provided below the gap 126, through the gap 126 is cooled by the cooling medium (S12).

The cooled process gas is supplied to the reaction chamber 10 through a plurality of through holes 144 which are disposed at a predetermined interval in the shower plate 140 provided below the buffer region 130.

The process gas supplied to the mixing chamber 110 is introduced to the reaction chamber 10 through the gaps 126, the buffer regions 130, and the through holes 144 and a film is formed on the wafer W (S14).

Then, the purge gas is supplied from the purge gas discharge hole 117 to the inner surface (inner wall) of the side wall of the reaction chamber 10 through the purge gas supply path 37 and the purge gas connection flow path 157.

When the growth of a film is completed, the temperature of the wafer W is reduced. Then, the wafer W is unloaded from the reaction chamber 10 by, for example, the robot hand.

The surplus process gas and a by-product of reaction are exhausted from the reaction chamber 10 by the exhaust mechanism 29, such as a vacuum pump, through the gas exhaust portion 28 provided in the lower part of the reaction chamber 10.

According to the vapor phase growth method according to the embodiment, it is possible to control the cooling of the process gas and to supply the process gas to the reaction chamber 10. Therefore, it is possible to grow a high-quality film on the wafer W.

In the embodiment, for example, portions which are not directly required to describe the invention, such as structures, are not described. However, for example, necessary structures can be appropriately selected and used. In addition, the shower head, the vapor phase growth apparatus using the shower head, and the vapor phase growth method which include the components according to the invention and whose design can be appropriately changed by those skilled in the art are included in the scope of the invention. The scope of the invention is defined by the scope of the claims and the scope of equivalents thereof.

What is claimed is:

1. A shower head comprising:
a mixing chamber to which process gas is supplied;
a plurality of cooling portions provided below the mixing chamber with gaps, each of the gaps provided between a pair of the cooling portions provided adjacently, each of the plurality of cooling portions having a cooling hole extending linearly in a predetermined direction parallel to a horizontal direction, the process gas being introduced from the mixing chamber to the gaps, the gaps extending linearly in the predetermined direction;
a plurality of buffer regions provided below the gaps, the process gas being introduced from the gaps to the buffer regions, the plurality of buffer regions extending linearly in the predetermined direction; and
a shower plate provided below the buffer regions, the shower plate having a plurality of through holes disposed at a predetermined interval, the process gas being introduced from the buffer regions to the plurality of through holes,
wherein a width of the gag is less than a width of the buffer region.

2. The shower head according to claim 1,
wherein a sum of an inside diameter of the plurality of through holes and the predetermined interval in a width direction of the buffer region is equal to or less than a width of the buffer region.

3. The shower head according to claim 1, further comprising a plurality of connection portions,
wherein the cooling portions are connected to the shower plate by the connection portions provided below the cooling portions.

4. The shower head according to claim 1,
wherein an inside diameter of the cooling hole is less than a length of the cooling portion in a direction perpendicular to a main surface of the shower plate.

5. The shower head according to claim 1,
wherein an inside diameter of the cooling hole is larger than a length of the buffer region in a direction perpendicular to a main surface of the shower plate.

6. The shower head according to claim 1,
wherein a length of the buffer region in a direction perpendicular to a main surface of the shower plate is larger than an inside diameter of the through hole.

7. The shower head according to claim 1,
wherein a center line of the through hole is perpendicular to a center line of the cooling hole.

8. A vapor phase growth apparatus comprising:
the shower head according to claim 1;
a reaction chamber provided below the shower head; and
a support portion provided in the reaction chamber, the support portion on which a substrate can be placed.

9. The shower head according to claim 1,
wherein each of the gaps is parallel to each of the plurality of buffer regions.

10. The shower head according to claim 1,
wherein at least a part of each of the buffer regions is provided under the cooling hole.

* * * * *